(12) United States Patent
Ronda

(10) Patent No.: US 8,125,157 B2
(45) Date of Patent: Feb. 28, 2012

(54) LIGHT SOURCE AND METHOD FOR PRODUCING LIGHT MODIFIABLE IN COLOUR AND/OR LUMINOSITY

(75) Inventor: Cornelis Reinder Ronda, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 868 days.

(21) Appl. No.: 12/063,799

(22) PCT Filed: Aug. 7, 2006

(86) PCT No.: PCT/IB2006/052713
§ 371 (c)(1),
(2), (4) Date: Feb. 14, 2008

(87) PCT Pub. No.: WO2007/020556
PCT Pub. Date: Feb. 22, 2007

(65) Prior Publication Data
US 2010/0164390 A1    Jul. 1, 2010

(30) Foreign Application Priority Data
Aug. 15, 2005 (EP) .................................... 05107479

(51) Int. Cl.
*H05B 41/16* (2006.01)
(52) U.S. Cl. ......................................... 315/246; 362/84

(58) Field of Classification Search ................. 315/246, 315/291; 349/69; 362/84; 313/483
See application file for complete search history.

(56) References Cited

U.S. PATENT DOCUMENTS

| | | | |
|---|---|---|---|
| 6,028,694 A | 2/2000 | Schmidt | |
| 6,628,249 B1 | 9/2003 | Kamikawa et al. | |
| 7,462,086 B2 * | 12/2008 | Mueller-Mach et al. | 445/23 |
| 7,479,732 B2 * | 1/2009 | Rossner | 313/503 |
| 7,651,529 B2 * | 1/2010 | Gellman et al. | 623/23.66 |
| 2002/0048177 A1 | 4/2002 | Rahm et al. | |

FOREIGN PATENT DOCUMENTS

| | | |
|---|---|---|
| JP | 2002324685 A | 11/2002 |
| WO | 2004025644 A1 | 3/2004 |
| WO | 2004060024 A1 | 7/2004 |
| WO | 2004082032 A2 | 9/2004 |

* cited by examiner

Primary Examiner — Thuy Vinh Tran
(74) Attorney, Agent, or Firm — John F. Salazar; Mark L. Beloborodov

(57) ABSTRACT

The present invention relates to a light source, which produces light leaving the light source with modifiable color and luminosity, with at least one light emitting diode for emitting primary radiation, comprising a layer connected with said diode, wherein said layer includes at least one luminescent material for converting the primary radiation into a secondary radiation.

12 Claims, 3 Drawing Sheets

Figure 1:
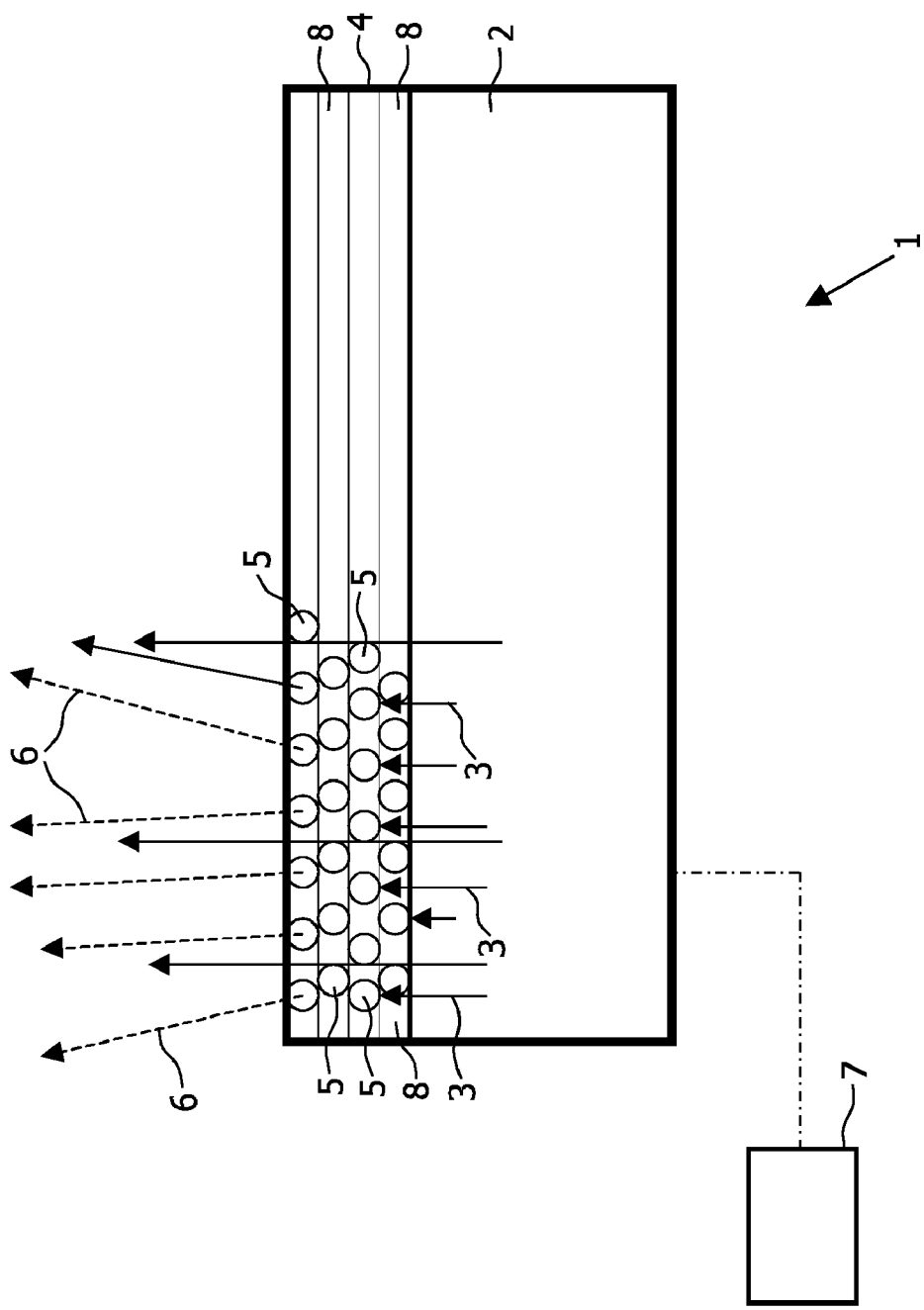

LIGHT SOURCE AND METHOD FOR PRODUCING LIGHT MODIFIABLE IN COLOUR AND/OR LUMINOSITY

The invention relates to a light source with at least one light emitting diode for emitting primary radiation comprising a layer connected with said diode, wherein said layer includes at least one luminescent material for converting the primary radiation into a secondary radiation.

It is known that light emitting diodes (LEDs) like phosphor-converted LEDs generate light with a high colour-rendering index. In a wide colour temperature range, however the colour temperature of the lights for each individual phosphor-converted LED is fixed. A considerable disadvantage is that by increasing the excitation density to the phosphors, the phosphors start to saturate due to ground state depletion or thermal quenching of the luminescence. During the saturation process the layer with the luminescent material transmits more and more primary radiation. Thus, the colour of light leaving the light source, which is a mixture of primary and the secondary radiation, is changed. One disadvantage of the known light sources is that the colour of the light, which leaves the light source, is changing, when the luminosity of the light is varied. Another problem is the temperature of each diode, which increases by increasing the power dissipation.

The invention has for its object to eliminate the above mentioned disadvantages. In particular, it is an object of the invention to provide a light source, which is simple and can be easily adjusted to produce a light, whereby the colour and/or the luminosity of the light is easily changeable without increasing the temperature of the light emitting diode substantially.

This object is achieved by a light source as taught by claim 1 of the present invention. Accordingly, a light source is provided, comprising a switching device driving the diode with a pulse-shaped current in order to provide a light, which includes the primary and/or the secondary radiation, in such a way that each of luminosity of the light and the colour are changeable independently. That means that the luminosity of the light is changeable without varying its colour and/or the colour of the light is changeable without varying the luminosity.

Preferably, the pulse-shaped current is pulse-width modulated, whereby in a possible embodiment the primary radiation can be visible light or invisible light. According to a preferred embodiment of the present invention the primary radiation is near ultra violet light (the first peak wavelength being in the range from 250 to 380 nm) or blue light (the first peak wavelength being in the range from 380 to 480 nm). One of the essential ideas of this invention is based on the fact, that driving the diodes with a pulse-shaped current the total light output can be controlled by the number of pulses, whereas the saturation of the luminescent material can be adjusted by the energy density per pulse (in units $J/cm^2/s$). With this arrangement of the present invention the diode emits a primary radiation radiating to the layer. Advantageously, the luminescent material comprises phosphors being excited by the photons from the primary radiation. Depending on the excitation density of the pulse-shaped current (particularly of the primary radiation) the luminescent material starts to saturate due to ground state depletion. During this saturation process the fraction of the primary radiation converted by the phosphors into the secondary radiation decreases, compared to the situation in which no saturation occurs. Depending on the phosphors the secondary radiation can be converted into different colours. Of course, the present invention can be driven in such a way that a change in colour is accompanied by a change in luminosity and vice versa.

Advantageously, the colour and luminosity of the light can be adjusted independently from each other by using a pulse width modulation (PWM). The degree of saturation is determined by the energy density in the pulse, the luminosity is adjusted by the pulse frequency. In this way, the tunability of the colour and luminosity can be obtained without an unacceptable increase of the power dissipation by the LED, which would lead to thermal quenching of the luminescence of the phosphors and to thermal degradation of the encapsulation of the LED. Finally, using the present invention in combination with sensors, the colour point of the LED light can be kept constant a long time.

Preferably, the layer is a ceramic phosphor layer. Depending on the saturation level more or less of the primary radiation emitted by the diode transmits the layer. The light leaving the light source includes the primary and/or the secondary radiation. Thus, the colour of the light is generated by a mixture of the colours of the primary and/or secondary radiation. In a preferred embodiment of the present invention the primary radiation is blue light. For example using CaS:Eu as a phosphor element in the layer the primary radiation is converted by the phosphors into a secondary radiation having red colour. Depending on the saturation grade of said phosphors some blue radiation transmits the layer, whereby a certain amount of red radiation is produced by the phosphors. The outcoming light is a mixture of the red and the blue radiation. In the saturated case the transparency of the layer for the blue light is increased. According to the present invention all colours located on the line in the x,y colour diagram between the primary colour generated by the LED (blue) and the red emitting colour generated by CaS:Ce can be produced for the light, which leaves the light source. One of the main advantages is that one present light source with one single diode can produce outcoming light with different, changeable colours.

Furthermore it is preferred that the layer comprises one or more of the following phosphors:
(red light)
CaS:Eu, SrS:Eu, (Ca,Sr)S:Eu, $(Y,Gd)_2O_2S$:Eu, $Y(VO_4)$:Eu, $(Sr,Ba,Ca)_2Si_5N_8$:Eu
(green/yellow light)
$Y_3Al_5O_{12}$:Ce, $(Y,Gd)_3Al_5O_{12}$:Ce, $(Ba,Sr,Ca)_2SiO_4$:Eu, CaS:Ce, ZnS:Cu, $La(PO_4)$:(Ce,Tb), $(Ce,Tb)Al_{12}O_{19}$, $(Ce,Gd,Tb)MgB_5O_{10}$, $BaMgAl_{10}O_{17}$:Eu,Mn, ZnS:Au
(blue light)
CaS:Cu, SrS:Ag, ZnS:Ag, $BaMgAl_{10}O_{17}$:Eu or $(Ca,Sr,Ba)_5(PO4)_3Cl$:Sb, $(Ca,Sr,Ba)_5(PO4)_3Cl$:Eu
(white light)
$(Ca,Sr,Ba)_5(PO_4)_3(F,Cl)$:Sb,Mn, $(Ca,Sr,Ba)_5(PO_4)_3(F,Cl)$:Eu,Mn For example the colour of the light can also be produced by mixing the primary and the secondary radiation. White light can be achieved by combining the colours blue and yellow and blue. Another possibility is to combine the colours green and red.

By using the white emitting phosphors, differences in saturation behaviour of the sensitising ions and the activator ions can be used for the tuning of the colour and luminosity.

Preferably, in phosphor mixtures the above mentioned phosphors comprise different saturation behaviour. That means, that by exciting the layer by the pulse-shaped current with a certain density some of the phosphors can be in the unsaturated mode, whereby other embedded phosphors are already in the saturated mode. Thus, the light source can produce all possible colours by driving the diode with certain pulse-shaped current, which is produced by the switching device connected to the light source.

According to another preferred embodiment of the present invention, the layer has a density d of the phosphor material being 1.5 g/cm³≦d≦10 g/cm³.

According to the invention, the light source can comprise a layer, which has a thickness n being 1 µm≦n≦1 mm, whereby the layer can be connected to the diodes by a form fit and/or adhesive bond and/or a frictional connection. In a more preferred embodiment a thickness n can be in the range of 10 µm≦n≦500 µm. Certainly, in an alternatively embodiment the thickness n of the layer can be greater than 1 mm, for example 1 cm. In this case the luminescent layer can comprise a ceramic layer form. Alternatively, the luminescent material can be embedded in glass.

Furthermore it is preferred that the layer includes phosphor grains, wherein the layer comprises at least one grain-layer. Preferably, the layer comprises a plurality of x grain-layers being 1≦x≦10. In a more preferred embodiment the layer includes x grain-layers being 2≦x≦5. During driving the diode with the pulse-shaped current the grain-layers provoke a certain scattering of the primary and/or secondary radiation, which is important for mixing the light leaving the light source. It must be considered that a strong scattering of the light reduces or even prevents transmission of the LED pump light through the phosphor layer. For this reason, a layer with a thickness of 2-5 grain-layers is preferred.

The preferred invention relates to a method for producing light with different colours including a light source with at least one light emitting diode for emitting primary radiation comprising a layer connected with said diode, wherein said layer includes at least one luminescent material for converting the primary radiation into a secondary radiation, a switching device driving the diode with a pulse-shaped current comprising a pulse width (pulse period) and a distance between the pulses (switching-off period), wherein the luminescent material, which comprises a decay time, is excited by the primary radiation in such a way that the luminosity of the light and the colour, which includes the primary and/or the secondary radiation, are changeable independently from each other, whereby the pulse width is substantially equal to the decay time. The pulse width and the pulse height are used to adjust the saturation of one or more of the luminescent materials. Preferably, the switching-off period is greater than the decay time of the luminescent material. In a preferred embodiment of the present invention the switching-off period is at least two times greater than the decay time, in a more preferred embodiment the switching-off period is at least 3-5 times greater than the decay time.

One of the advantages of the present invention is that the luminosity of the light leaving the light source is changeable by varying the distance between the pulses, whereby the colour of the light is substantially constant. During the drive of the diode it is possible that the switching-off period is decreased, whereby the luminosity of the outcoming light is increased, while its colour does not vary, substantially. Advantageously, the LED is excited by a fixed pulse width, whereby a change of the energy of the pulse varies the degree of saturation. By increasing the energy of the pulse the saturation behaviour can be achieved. Thus, the colour of the light is changing. The result of driving the LED with a long off period is that the activators of the phosphor reach the ground state before the next pulse is applied. Thus, a further increase in the off period will decrease the luminosity without changing the colour. By a proper adjustment of the pulse height and PWM, colour changes can be achieved without changing the luminosity. Additionally, the present method for producing light reduces the effects provoked by slight wavelength variations in the LED emission, when more than one additional colour is generated by the luminescence converting layer. In this case sensors might be needed. Furthermore, the present invention offers the opportunity to correct effects due to phosphor degradation.

The light source as well as the method mentioned above can be used in a variety of systems amongst them systems being automotive systems, home lighting systems, backlighting systems for displays, ambient lighting systems, flashes for cameras (with adjustable colour) or shop lighting systems.

The aforementioned components, as well as the claimed components and the components to be used in accordance with the invention in the described embodiments, are not subject to any special exceptions with respect to the size, shape, material selection as technical concept such that the selection criteria known in the pertinent field can be applied without limitations.

Additional details, characteristics and advantages of the object of the invention are disclosed in the subclaims and the following description of the respective Figure—which is an exemplary fashion—show one preferred embodiment of the light source according to the invention.

Figure 2:
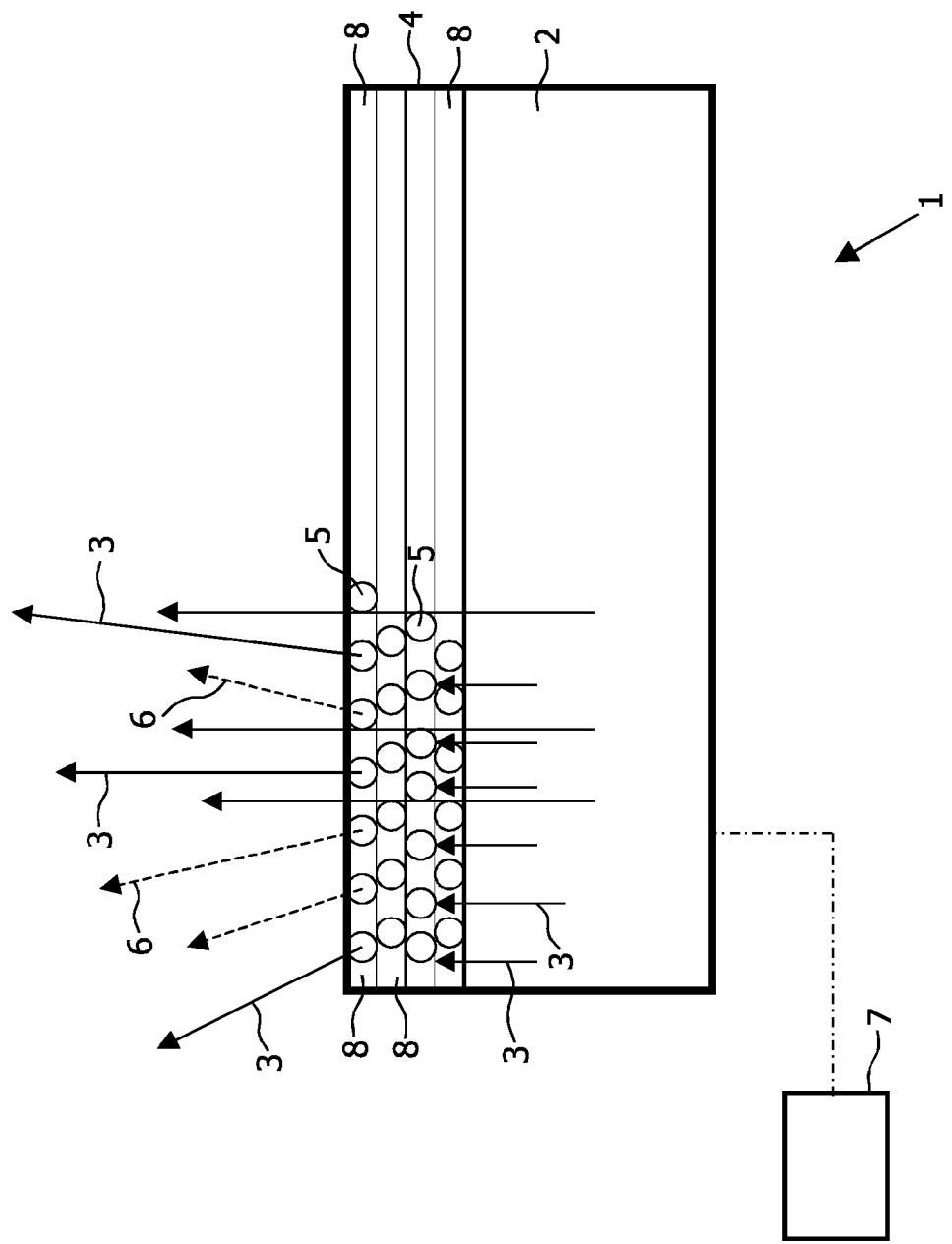
Figure 3:
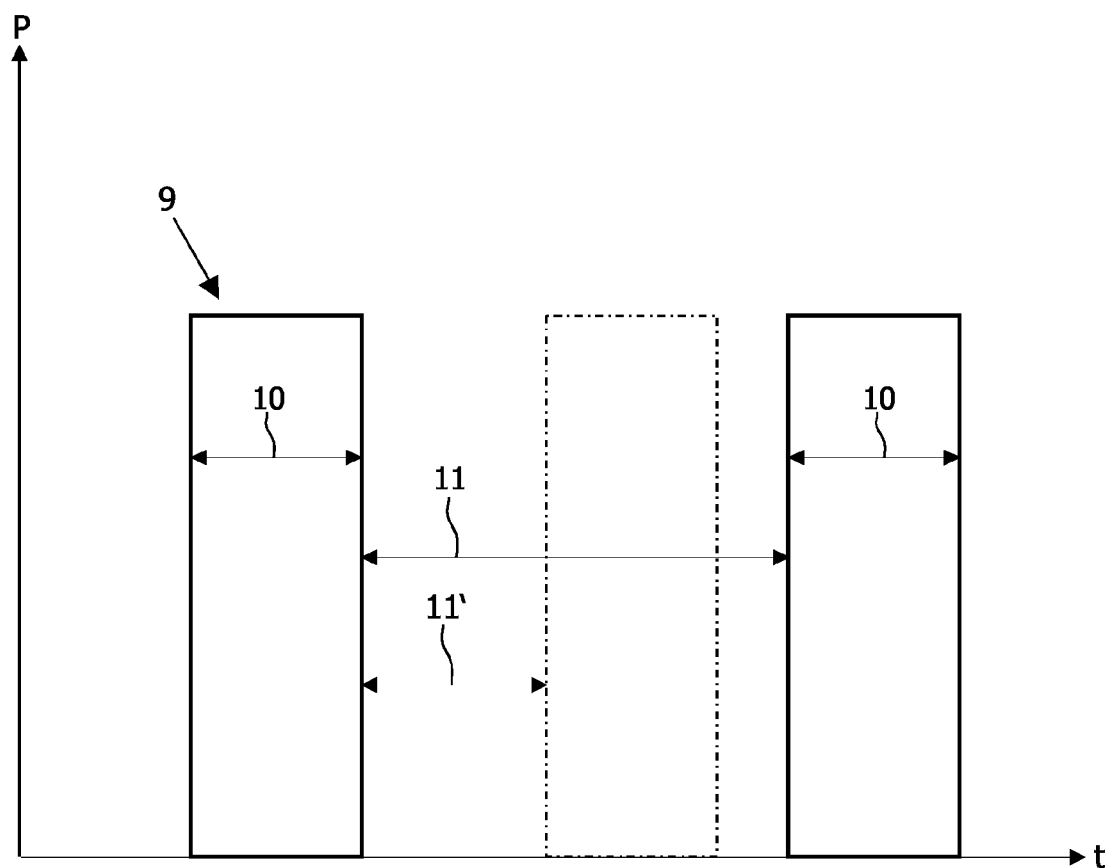

FIG. 1 shows a schematic view of a light source comprising a diode and a layer with a luminescent material, whereby the luminescent material is in an unsaturated mode, FIG. 2 shows the light source according to FIG. 1, whereby the luminescent material is in a saturated mode and FIG. 3 shows a schematic diagram of a pulse-shaped current, which drives the diode according to FIG. 1

FIG. 1 shows a light source 1 comprising a single light emitting diode 2 connected to a switching device 7. On the top of the diode 2 a layer 4 with a luminescent material 5 is placed. Driving the diode 2 with a pulse-shaped current the diode 2 emits a visible light 3, which is radiated in direction to the layer 4. In this embodiment the visible light 3 (primary radiation) is a blue light, the first peak wavelength being at 455 nm. While the diode 2 emits the primary blue radiation 3, the luminescent material 5 embedded in the layer 4 is excited by the photons of the blue radiation 3, whereby the blue light 3 is converted into a secondary radiation 6. In the shown embodiment of FIG. 1 and FIG. 2 the luminescent material 5 comprises phosphors, which emits during the conversion yellow light. In the described FIG. 1 and FIG. 2 CaS:Eu is used as phosphor material.

On increasing the excitation density of the pulse width modulation (PWM), the phosphors 5 start to saturate because of the ground state depletion. The result is that the phosphor layer 4 transmits more blue pump light. In the unsaturated mode, shown in FIG. 1, the light source 1 produces light substantially with an amber colour. In the saturated case of the phosphors 5 a lot of blue radiation 3 is transmitted by the layer 4. That means, that in the saturated case more blue light 3 leaves the light source 1 because of the increased transparency of the layer 4 for blue light 3.

The outcoming light includes the primary 3 and the secondary radiation 6. By varying the excitation density to the phosphors 5, the saturation grade of the phosphors 5 can be adjusted. Depending on the excitation density the colour of the outcoming light, which is a mixture of the colour of the primary 3 and the secondary radiation 6, can be generated.

According to FIG. 1 and FIG. 2 the outcoming light of the light source 1 can comprise all colours between the colours blue and yellow.

The phosphors 5 are embedded in an organic material, which for example can be an acrylic or silicon material. The described phosphors 5 are single grains 5, whereby the density of the phosphor material 5 in the layer 4 is approximately 5 g/cm³. The thickness of the layer 4 is approximately 10 µm. As shown in FIG. 1 and FIG. 2 the layer 4 consists of 4 grain-layers 8. The more the layer 4 comprises grain-layers 8, the more the outcoming light is dispersed by the luminescent material 5. That means that on increasing the number of the grain-layers 8 less outcoming light is generated by the light source 1. This coherence can be important for generating light of other non-described light sources.

Surprisingly it has been found out, that driving the diode 2 with a pulse-shaped current 9 comprising a pulse width 10 (pulse period) and a distance between the pulses 11 (switching-off period), the luminosity and the colour of the light, which includes the primary 3 and/or the secondary radiation 6, are changeable independently from each other, whereby the pulse width 10 is substantially equal to the decay time. FIG. 3 shows two schematic diagrams of a pulse-shaped current 9 driving the diode 2. Advantageously, setting the switching-off period 11 at least three times greater than the decay time the luminosity of the light is changeable without varying the colour of the outcoming light. In the shown embodiment the switching-off period 11 is 5 times greater than the decay time. By decreasing the switching-off period 11', as shown in FIG. 3, the luminosity of the outcoming light is increased, whereby the colour of the outcoming light is substantially constant. Certainly, the distance between the pulses 11 can be smaller than the decay time, particularly equal to the decay time.

In the described embodiment the saturation due to ground state depletion is expected when the number of exciting photons I, the number of emitting ions in the excited volume (N) and the decay time of the phosphors, particularly of the emission of a activator τ, which is included by the phosphors 5, show the following relation:

$$I \geq N/\tau.$$

This expression for continuous excitation, semi continuous excitation is obtained when the time width of the excitation pulse is substantially longer than the emission decay time. Saturation effects can also be observed in cases, where the time width of the excitation pulse is shorter than the emission decay time. Assuming an emitting area of 1 mm², a phosphor layer thickness of 10 µm, a packing density of 50%, a density of the phosphor material of 5 g/cm³, a mole mass 100 a.m.u., an activator concentration of 1% and a decay time of 1 µs, saturation is expected for values of I exceeding about $10^{21}$/cm². This corresponds to excitation energy of about 50 W/mm² Thus, fast decaying phosphors (decay time <<1 µs) do not show a saturation as a consequence of ground state depletion when typical concentrations of activators are used. Nevertheless to use these phosphors, the concentration of the activators has to be decreased. This induces a smaller optical absorption, which can be enhanced again by using larger phosphor grains. Alternatively, ceramic phosphor layers or luminescent materials embedded in glass can be used.

In another non-described embodiment phosphors 5 with activators showing forbidden transitions can be used as well, provided that the emission can be sensitised. On assuming a decay time of the emission of for example 1 ms, saturation of the sensitised emission is already expected at energy densities of about 0.05 W/mm². To prevent a strong loss in energy efficiency, the sensitiser emission could also be exploited (the intensity of the sensitiser emission increases, as energy transfer to activators is hindered by the fact that many of the activator ions are excited).

Alternatively, the layer 4 being a phosphor ceramic can comprise different phosphors 5, which emit during the conversion a secondary radiation 6. For example this radiation 6 can comprise a green or a blue colour. Preferably, using phosphors 5 with different saturation behaviour many different colours of outcoming light can be generated. On increasing excitation density by PWM, the colour of the outcoming light changes correspondingly.

Certainly, the diode 2 of the described embodiment can emit ultra violet light, the first peak wavelength being in the range from 250 to 380 nm. Preferably, CaS:Cu, SrS:Ag, ZnS:Ag, $BaMgAl_{10}O_{17}$:Eu or $(Ca,Sr,Ba)_5(PO4)_3Cl$:Sb, $(Ca,Sr,Ba)_5(PO4)_3Cl$:Eu are used as phosphors 5 in the layer 4. These phosphors 5 are excited by the ultra violet light emitted by the diode 2 and convert the ultra violet light into blue light. Advantageously, the layer 4 comprises additionally phosphors 5, which convert the primary radiation 3 into a secondary radiation 6, which has different colours, for example yellow or green or white.

The present invention refers as well to a light source system, comprising an array of single light sources described above.

LIST OF NUMERALS 1 light source
2 emitting diodes, LED
3 primary radiation
4 layer
5 luminescent material, grain
6 secondary radiation
7 switching device
8 grain-layer
9 pulse-shaped currents
10 pulse width, Pulse period
11 switching-off period, distance between the pulses

The invention claimed is:

1. A light source for producing light with modifiable colours and including
    at least one light emitting diode for emitting primary radiation,
    a layer coupled with said at least one light emitting diode and including at least one luminescent material for converting the primary radiation into a secondary radiation,
    a switching device for driving the at least one light emitting diode with a pulse-shaped current using pulse with modulation to effect production of the primary and secondary radiation in such a way that the luminosity of the light and the colour are changeable independently, wherein a pulse width of the pulse-shaped current is substantially equal to a decay time of the luminescent material and is operably modified by controlling said control device to change said luminosity and a pulse height is operably modified by controlling said switching device to modify said colour.

2. The light source as claimed in claim 1, wherein the primary radiation is visible light or invisible light.

3. The light source as claimed in claim 1, wherein the at least one luminescent material comprises phosphors.

4. The light source as claimed in claim 1, wherein the layer comprises one or a combination of the following phosphors:
    (red)
    CaS:Eu, SrS:Eu, (Ca,Sr)S:Eu, $(Y,Gd)_2O_2S$:Eu, $Y(VO_4)$:Eu, $(Sr,Ba,Ca)_2Si_5N_8$:Eu,
    (green/yellow)
    $Y_3Al_5O_{12}$:Ce, $(Y,Gd)_3Al_5O_{12}$:Ce, $(Ba,Sr,Ca)_2SiO_4$:Eu, CaS:Ce, ZnS:Cu, $La(PO_4)$:(Ce,Tb),
    $(Ce,Tb)Al_{12}O_{19}$, $(Ce,Gd,Tb)MgB_5O_{10}$, $BaMgAl_{10}O_{17}$:Eu,Mn, ZnS:Au, (blue)
CaS:Cu, SrS:Ag, ZnS:Ag, BaMgAl$_{10}$O$_{17}$:Eu or (Ca,Sr,Ba)$_5$ (PO4)$_3$Cl:Sb,
(Ca,Sr,Ba)$_5$(PO4)$_3$Cl:Eu,
(white)
(Ca,Sr,Ba)$_5$(PO$_4$)$_3$(F,Cl):Sb,Mn, (Ca,Sr,Ba)$_5$(PO$_4$)$_3$(F,Cl):Eu,Mn.

5. The light source as claimed in claim 1, wherein a phosphor material of the layer has a density d being 1.5 g/cm$^3$≦d≦10 g/cm$^3$.

6. The light source as claimed in claim 1, wherein the layer includes phosphor grains, wherein the layer comprises at least one grain-layer.

7. The light source as claimed in claim 6, wherein the layer comprises x grain-layers being 1≦x≦10.

8. A light source for producing light including
at least one light emitting diode for emitting primary radiation,
a layer coupled with said at least one light emitting diode and including at least one luminescent material for converting the primary radiation into a secondary radiation,
a switching device for driving the at least one light emitting diode with a pulse-shaped current comprising a pulse width (pulse period) and a distance between pulses (switching-off period), wherein
the at least one luminescent material, which has a decay time, is excited by the primary radiation in such a way that the luminosity and the colour of the light leaving the at least one light emitting diode are changeable independently from each other, whereby the pulse width is modifiable to be substantially equal to the decay time, allowing said switching device to operably modify said luminosity and whereby said pulses are operably modified by controlling said switching device to independently change said colour relative to said luminosity.

9. The light source as claimed in claim 8, wherein the distance between the pulses is greater than the decay time of the luminescent material.

10. The light source as claimed in claim 9 wherein the distance between the pulses is at least twice the decay time.

11. The light source as claimed in claim 8 wherein the luminosity of the light leaving the light source is changeable by varying the distance between the pulses, whereby the colour of the light is substantially constant.

12. A light source for producing modifiable colour and light intensity, comprising:
at least one light emitting diode for emitting primary radiation;
a layer in optical alignment with said at least one light emitting diode and including at least one luminescent material for converting said primary radiation into a secondary radiation;
a switching device in electrical communication with said at least one light emitting diode and operably driving said at least one light emitting diode with pulse width modulated current having an off-pulse time period between pulses;
wherein said at least one luminescent material has a decay time and is excited by said primary radiation in such a way that the luminosity and the colour of said light leaving said light source are changeable independently from each other;
whereby said off-pulse time period is modifiable to be equal to or greater than said decay time and is modifiable to change the luminosity of said at least one light emitting diode,
and further whereby pulse heights are operably modified by controlling said switching device to independently change said colour relative to said luminosity;
said pulse heights varying a saturation level of said at least one luminescent material thereby changing said colour.

* * * * *